US007544614B2

(12) United States Patent
Yudasaka

(10) Patent No.: US 7,544,614 B2
(45) Date of Patent: Jun. 9, 2009

(54) METHOD OF FORMING A COATED FILM, METHOD OF FORMING AN ELECTRONIC DEVICE, AND METHOD OF MANUFACTURING AN ELECTRON EMISSION ELEMENT

(75) Inventor: Ichio Yudasaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 242 days.

(21) Appl. No.: 11/322,231

(22) Filed: Jan. 3, 2006

(65) Prior Publication Data

US 2006/0188648 A1 Aug. 24, 2006

(30) Foreign Application Priority Data

Feb. 24, 2005 (JP) ............................ 2005-049287

(51) Int. Cl.
*H01L 21/20* (2006.01)

(52) U.S. Cl. ...................... 438/677; 438/761; 438/790; 257/E21.174; 257/E21.175; 257/E21.243; 257/E21.279; 257/E21.576; 257/E23.161; 257/E29.117; 257/E29.147

(58) Field of Classification Search ................. 438/496, 438/677, 761, 790, 794, 974; 257/E31.119, 257/E23.132, E21.174, 175, 243, 275, 279, 257/413, 576, 586, 589, E23.161, E29.117, 257/147

See application file for complete search history.

(56) References Cited

U.S. PATENT DOCUMENTS

| | | | | |
|---|---|---|---|---|
| 4,711,699 | A | 12/1987 | Amano | |
| 5,605,867 | A * | 2/1997 | Sato et al. | 438/790 |
| 5,989,945 | A * | 11/1999 | Yudasaka et al. | 438/149 |
| 6,495,005 | B1 * | 12/2002 | Colgan et al. | 204/224 R |
| 6,500,885 | B1 * | 12/2002 | Porter et al. | 524/94 |
| 6,803,707 | B2 * | 10/2004 | Ishiwata et al. | 313/310 |
| 7,238,615 | B2 * | 7/2007 | Miyakawa | 438/677 |
| 2005/0179026 | A1 * | 8/2005 | Myers et al. | 257/14 |

FOREIGN PATENT DOCUMENTS

| | | |
|---|---|---|
| JP | A 62-030351 | 2/1987 |
| JP | A 04-094032 | 3/1992 |
| JP | 2004-192812 | 7/2004 |

OTHER PUBLICATIONS

Wolf, S, Silicon Processing for the VLSI Era, SOG Process Integration, 1990, Lattice Press, vol. 2-Process Integration , 232-233.*
M. I. Elinson in Radio Eng. Electron Phys., 120, 1290 (1965).

* cited by examiner

*Primary Examiner*—Michael S Lebentritt
(74) *Attorney, Agent, or Firm*—Oliff & Berridge, PLC

(57) ABSTRACT

A slit forming process with respect to a coated film, includes:
forming a step pattern having an end part on a substrate;
coating a liquid material for forming a coated film on the substrate in the manner of covering at least the end part of the step pattern; and
forming the coated film by drying the coated liquid material, together with forming a slit at a position corresponding to the end part of the step pattern.

6 Claims, 6 Drawing Sheets

METHOD OF FORMING A COATED FILM, METHOD OF FORMING AN ELECTRONIC DEVICE, AND METHOD OF MANUFACTURING AN ELECTRON EMISSION ELEMENT

BACKGROUND OF THE INVENTION

1. Technical Field

The invention relates to a slit forming process, a manufacturing process of an electron emission element, and an electronic device.

2. Related Art

An electron emission element equipped with a pair of element electrodes, which are arranged opposite to each other on an insulating substrate, and a conductive thin film provided connectingly with the element electrodes is known. As an example, there is an electron emission element made public by M. I. Elinson in Radio Eng. Electron Phys., 120, 1290 (1965).

Forming a conductive thin film in such electron emission element is normally conducted by a process mainly consisting of a semiconductor process such as a vacuum evaporation process, etching, and liftoff. However, such process calls for specialized, expensive manufacturing equipment. Since it requires a plurality of steps associated with patterning, there is a problem of high production cost particularly in case of forming numerous electron emission elements for a large substrate.

Against this background, there is proposed a process (hereinafter referred to as the "inkjet process") of forming a conductive thin film without employing a semiconductor process, by using an inkjet device and coating a liquid material (hereinafter referred to as the "conductive material"), which includes metallic elements for forming the conductive thin film, upon a substrate (for example, refer to the first example of related art.)

FIG. 7 is a diagram showing a manufacturing process of an electron emission element according to the inkjet process.

First, a pair of element electrodes 21 and 22 is formed on a substrate 20 by using photolithography and the like (refer to FIG. 7A). Next, a conductive material is coated between the element electrodes 21 and 22 by using the inkjet device, then, subjected to heating and baking, thus forming a conductive thin film 30 connected to the element electrodes 21 and 22 (refer to FIG. 7B). And, an electron emission element is formed by applying a continuity process (hereinafter referred to as the "forming process") called forming to the conductive thin film 30 to cause the conductive thin film to generate an nanometric size slit and the like (refer to FIG. 7C).

JP-A-2004-192812 is an example of related art.

Now, it is necessary to control a position of a slit 40 in precision to obtain a uniform property in regard to a plurality of electron emission elements formed on the substrate 20, while there was an extremely difficult problem of finely controlling the position of the slit 40 by means of the forming process.

SUMMARY

An advantage of the invention is to provide a slit forming technique which can finely control a position of a slit to be formed on a coated film.

According to a first aspect of the invention, a slit forming process includes forming a step pattern having an end part on a substrate; coating a liquid material for forming a coated film in a manner of covering at least the end part of the step pattern; and forming a coated film by drying a coated liquid material, together with forming a slit at a position corresponding to the end part of the step pattern.

According to such construction, with a simple process of forming the step pattern, it is possible to finely control the slit position. Such technique is applicable to a variety of fields. For example, application to the formation of an electron emission element makes it possible to form an electron emission element of high electron emission efficiency.

According to the slit forming process, the step pattern may be formed with an insulating material and the liquid material may be a liquid material for forming a conductive film. Further, the step pattern may be formed of a conductive material and the liquid material may be a liquid material for forming an insulating film.

According to a second aspect of the invention, a manufacturing process of an electron emission element includes forming a pair of opposite element electrodes opposite to each other on the substrate; forming a step pattern having an end part in an area between the element electrodes on the substrate; coating a liquid material for forming a conductive film in the manner of covering at least the end part of the step pattern as well as covering part of the respective element electrodes; and forming a conductive film by drying the coated liquid material, together with forming a slit at a position corresponding to the end part of the step pattern in the conductive film.

According to a third aspect of the invention, another manufacturing process of an electron emission element includes forming a step pattern having an end part on a substrate; coating a liquid material for forming a conductive film in the manner of covering at least the end part of the step pattern; and forming a conductive film by drying a coated liquid material, together with forming a slit at a position corresponding to the end part of the step pattern in the conductive film and forming a pair of element electrodes there.

The electron emission element manufactured according to these manufacturing processes may be applied to electronic devices. The electronic device herein means equipment in general provided with an electron emission element according to the invention performing a fixed function, being constructed, for example, with provision of an electro-optical device and a memory. There is no specific limitation regarding its construction but including, for example, an image forming device, an IC card, a mobile phone, a video camera, a personal computer, a head mount display, a rear type or a front type projector, further, a fax machine with a display function, a digital camera finder, a portable TV, a DSP device, a PDA, an electronic note, an electric bulletin board, and an advertising display.

BRIEF DESCRIPTION OF THE DRAWINGS

The invention will be described with reference to the accompanying drawings, wherein like numbers refer to like elements.

DESCRIPTION OF THE EMBODIMENTS

Before describing embodiments according to the invention, a basic principle of the invention will now be described.

A. Basic Principle

Figure 1:
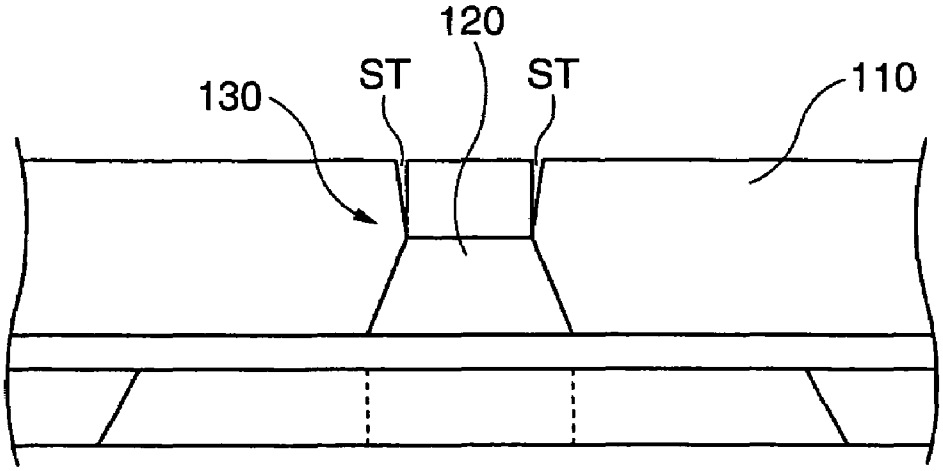
FIG. 1 is a diagram for explaining a basic principle of the invention.
Figure 2:
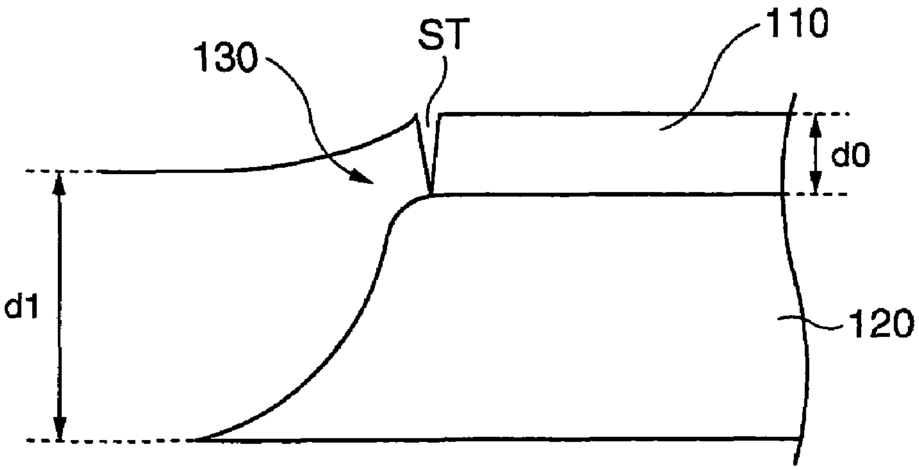
FIG. 2 is a diagram for explaining the basic principle of the invention.

FIG. 1 is a diagram showing a relationship between a gate electrode and an interlayer insulating film which make up a TFT (Thin Film Transistor). FIG. 2 is a partly enlarged view of a vicinity of a gate electrode shown in FIG. 1. An interlayer insulating film 110 is an insulating film covering an entire surface of a substrate including a gate electrode (step pattern) 120, which is formed of a conductive material, being formed by subjecting it to coating a liquid material (liquid material for forming an insulating film) including polysilazane, drying and the like.

As shown in FIG. 1, when the interlayer insulating film 110 is formed by a coating process, a step 130 is formed between a portion covering an end part of the gate electrode (step pattern) 120 and other portion. Investigation of this step part by processes using a sectional TEM (Transmission Electron Microscope) and an AFM (Atomic Force Microscope) discovered formation of a slit ST at the step part (refer to FIG. 2). Further investigation produced findings that a width and a depth of this slit ST are caused by a height and shape of the step as well as forming conditions (material, drying condition and the like) of the interlayer insulating film 110, and that a film thickness difference (d1−d0) between a film thickness d1 of the other portion and a film thickness d0 of the portion covering the gate electrode 120 was caused by a pattern size of the gate electrode 120.

It should be noted that a mechanism accounting for how the slit ST is formed is not made clear yet. But it is presumed that a difference in a degree of film contraction caused by the film thickness difference (d1−d0) between the film thickness d0 of the portion covering the gate electrode 120 and the film thickness d1 of the other portion is responsible for the formation of the slit ST. Embodiment using such phenomenon will be described with reference to drawings.

B. First Embodiment

Figure 3A:
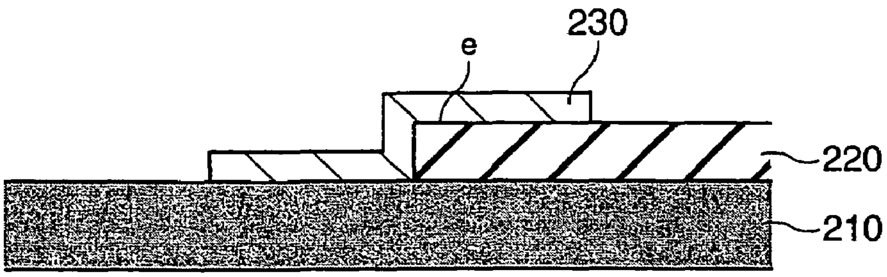
FIG. 3 is a process chart showing a manufacturing process of an electron emission element according to a first embodiment.
Figure 3B:
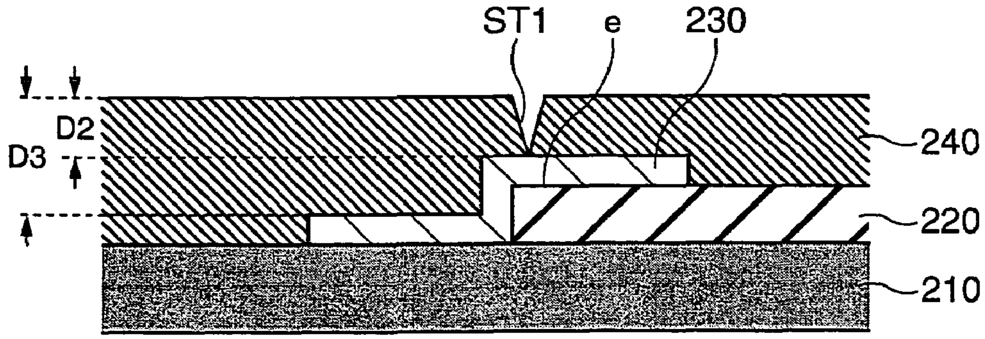
Figure 3C:
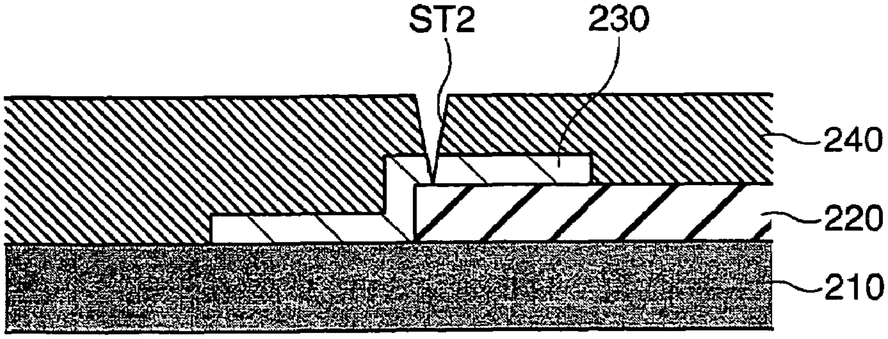
Figure 4:
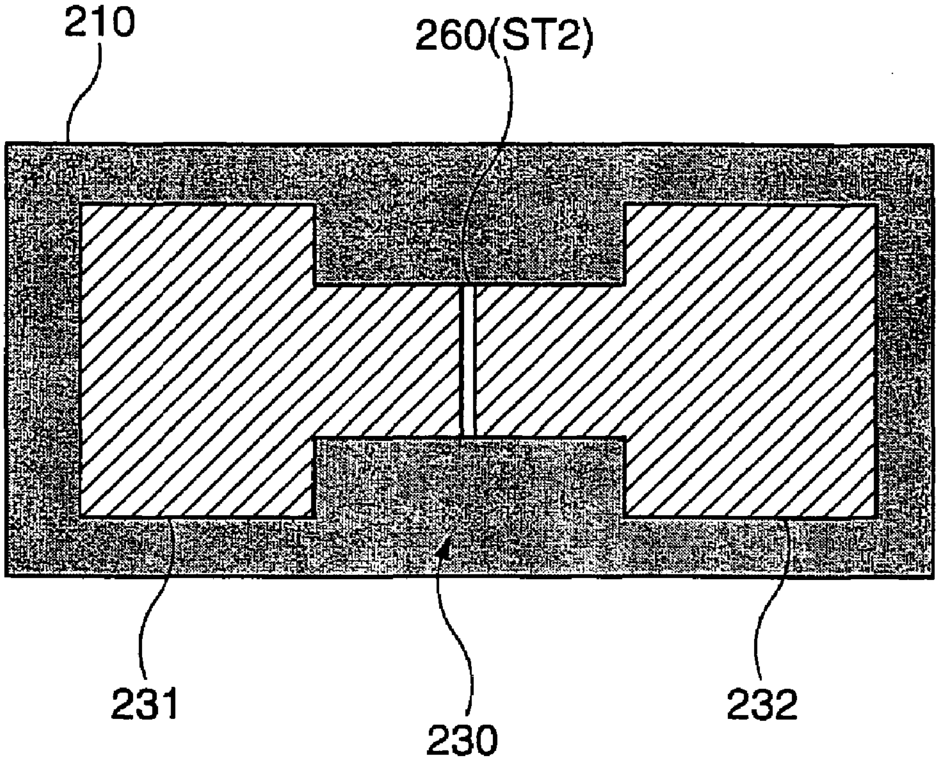
FIG. 4 is a plan view of an electron emission element according to the first embodiment.

FIG. 3 is a process chart showing a manufacturing process of a surface conductive type electron emission element, and FIG. 4 is a plan view of the surface conductive type electron emission element.

First, at a desired position of the substrate 210, a liquid material (insulating material) such as polysilazane is coated, and by performing processing such as baking and annealing (about 5 minutes at 100° C., and further 60 minutes at 350° C.), a first insulating film (step pattern) of a desired shape is formed. And in a manner of covering an end part e of a first insulating film 220, a conductive film 230 for forming an element electrode is formed (refer to FIG. 3A). It should be noted that the first insulation film 220 and the conductive film 230 may be formed by using physical vapor deposition (PVD), chemical vapor deposition (CVD) and the like.

Further, over an entire surface of the substrate 210 on which the first insulation film 220 and the conductive film 230 are formed, a liquid material (insulating material) such as polysilazane is coated. In the same way as described above, the baking and annealing processing is applied, thereby forming a second insulating film 240.

At this point, a film thickness D2 of the conductive film 230 and the second insulating film 240, which cover the end part e of the first insulating film 220, is thinner than a film thickness D3 of the other portion. As a result of a difference in the degree of film contraction generated by such thickness difference (D3−D2), a slit ST1 is formed in the second insulating film 240 (position corresponding to the end part of the step pattern) positioned directly above the end part e of the first insulating film 220 (refer to FIG. 3B).

Thereafter, by etching using an etchant for conductive film, the slit ST1 formed in the second insulating film 240 is transferred to the conductive film 230 (refer to FIG. 3C). Subsequently, by etching further, a slit ST2 formed in the conductive film 230 is subjected to fine adjustment in regard to its width and depth, and the second insulating film 240 is peeled. As a result, there is formed a surface conductive type electron emission element with formation of an electron emission section 260 between a pair of element electrodes 231 and 232 (refer to FIG. 4).

C. Second Embodiment

FIG. 5 is a process chart showing a process of forming a slit in the conductive film 230.

Figure 5A:
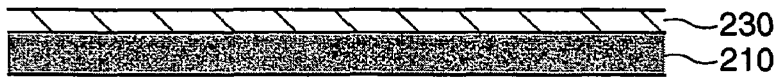
FIG. 5 is a process chart showing a slit forming process of a conductive film according to a second embodiment.
Figure 5B:
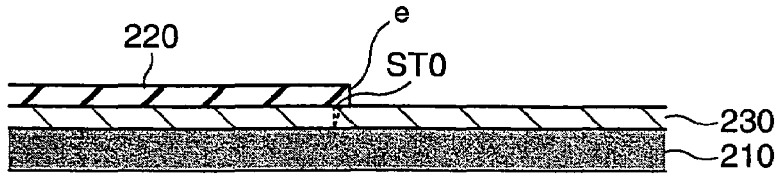
Figure 5C:
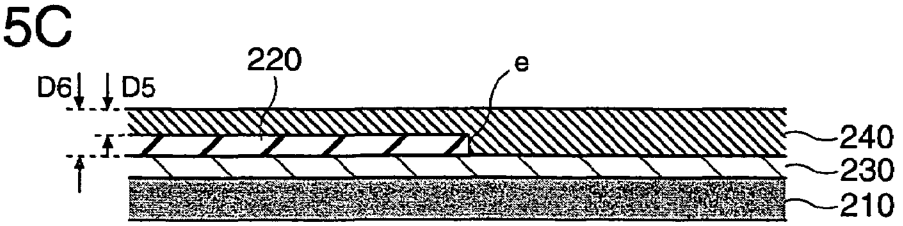
Figure 5D:
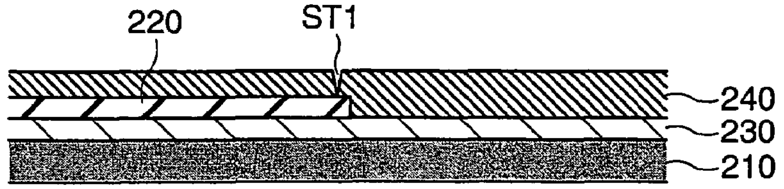

First, a conductive film 230 is formed over the entire surface of the substrate 210 by using physical vapor deposition (PVD), chemical vapor deposition (CVD) and the like (refer to FIG. 5A). At a desired position of this conductive film 230, a liquid material (insulating material) such as polysilazane is coated, and by performing the baking and annealing processing (about 5 minutes at 100° C., and further 60 minutes at 350° C.) and further photo-etching, for example, a first insulating film (step pattern) 220 of a film thickness of about 5μ (refer to FIG. 5B) is formed. This first insulating film 220 is formed such that the end part e thereof may be positioned approximately directly above the slit position ST0 where a slit of the first insulating film 230 is planned to be formed.

Further, over the entire surface of the substrate 210 on which the first insulation film 220 is formed, a liquid material (insulating material) such as polysilazane is coated. In the same way as described above, by performing the baking and annealing processing, for example, a second insulating film 240 of a film thickness of about 0.3 μm (refer to FIG. 5C) is formed.

At this point, a film thickness D5 of the second conductive film 240 of the portion covering the first insulating film 220 is thinner than a film thickness D6 of the other portion. As a result of such difference in the degree of film contraction generated by such thickness difference (D6−D5), a slit ST1 is formed in the second insulating film 240 positioned directly above the end part e of the first insulating film 220 (refer to FIG. 5D).

Figure 5E:
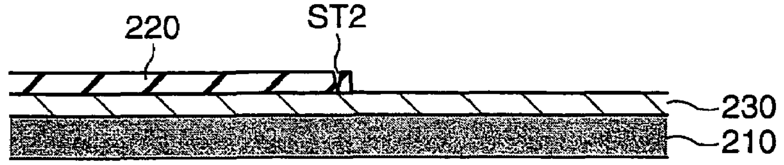
Figure 5F:
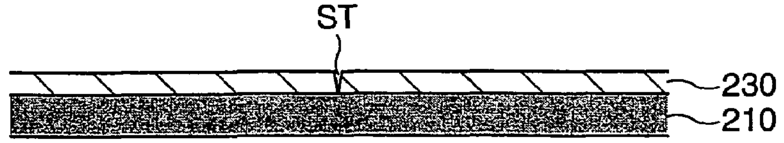

Thereafter, by etching, a slit ST2 is formed on the first insulating film 220 (refer to FIG. 5E). Subsequently, by etching further, a slit ST is formed at a position ST0 where the conductive film 230 is planned to be formed (refer to FIG. 5F). Then, by etching still further, fine adjustment is made in regard to its width and depth.

In this manner a surface conductive type electron emission element shown in FIG. 4 may be formed by forming the slit ST at the desired position of the conductive film 250. It should be noted that the slit forming process described above is also applicable to a surface conductive type electron emission element of other mode.

Specifically, a pair of opposite element electrodes are first formed on a substrate, and a first insulating film (step pattern) having an end part in an area between the element electrodes on the substrate is formed. And a liquid material for forming a conductive film is coated to cover at least the first insulating film and part of the respective element electrodes.

Further, by subjecting the coated liquid material to drying, baking and the like, a conductive film is formed, together with forming a slit at a position corresponding to the end part of the step pattern in the insulating film, a surface conductive type electron emission element may be formed.

D. Third Embodiment

FIG. 6 is a diagram illustrating an electronic device according to a third embodiment.

Figure 6A:
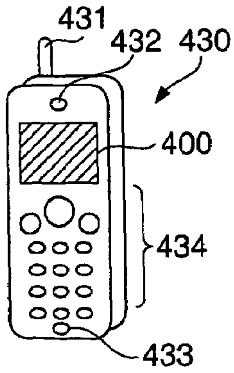
FIG. 6 is a diagram showing an electronic device according to a third embodiment.

FIG. 6A is a mobile phone manufactured according to a manufacturing process of the invention. The mobile phone 430 consists of an electro-optical device (display panel) 400, an antenna unit 431, a voice output unit 432, a voice input unit 433, and an operating unit 434. The invention is, for example, applicable to manufacturing a plurality of electron emission elements making up a display panel 400.

Figure 6B:
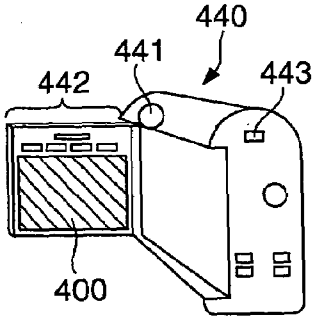

FIG. 6B is a video camera manufactured according to the manufacturing process of the invention. The video camera 440 is made up of an electro-optical device (display panel) 400, an image receiving unit 441, an operating unit 442, and a voice input unit 440. The invention is, for example, applicable to manufacturing a plurality of electron emission elements making up the display panel 400.

Figure 6C:
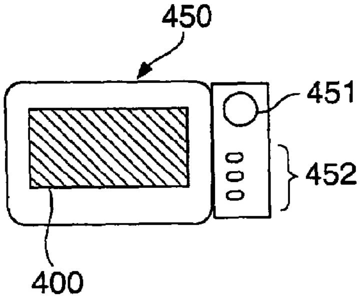

FIG. 6C is an example of a laptop personal computer manufactured according to the manufacturing process of the invention. The computer 450 consists of an electro-optical device (display panel) 400, a camera section 451, and an operating section 452. The invention is, for example, applied to manufacturing a plurality of electron emission elements making up the display panel 400.

Figure 6D:
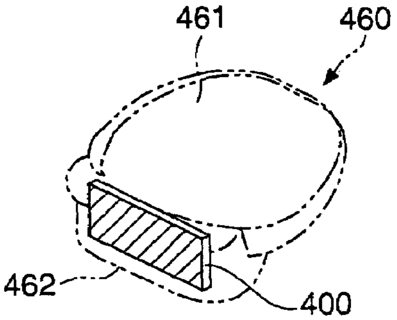

FIG. 6D is an example of a head mount display manufactured according to the manufacturing process of the invention. The head mount display 460 consists of an electro-optical device (display panel) 400, a band section 461, and an optical system storage section 462. The invention is, for example, applied to manufacturing a plurality of electron emission elements making up the display panel 400.

Figure 6E:
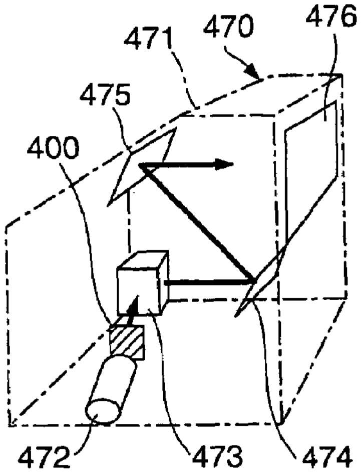

FIG. 6E is an example of a rear type projector manufactured according to the manufacturing process of the invention. The projector 470 consists of an electro-optical device (optical modulator) 400, a light source 472, a synthetic optical system 473, and mirrors 374 and 375 in a frame 371. The invention is, for example, applied to manufacturing a plurality of electron emission elements making up the optical modulator 400.

Figure 6F:
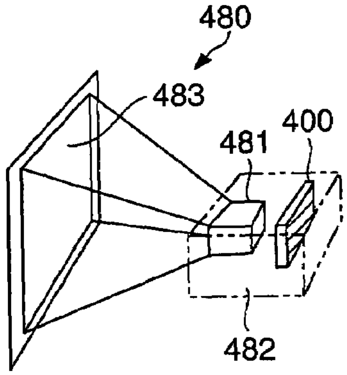
Figure 7A:
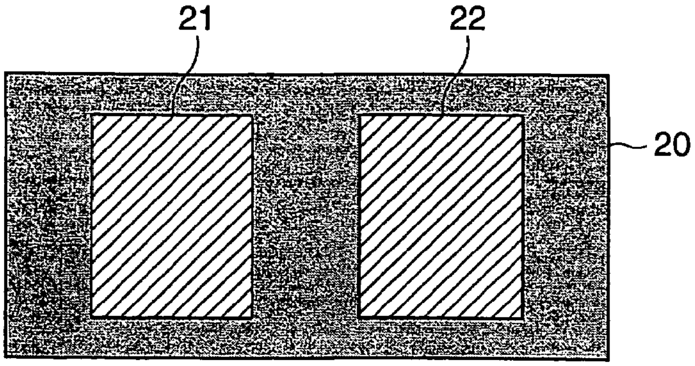
FIG. 7 is a process chart showing a manufacturing process of a currently available electron emission element.
Figure 7B:
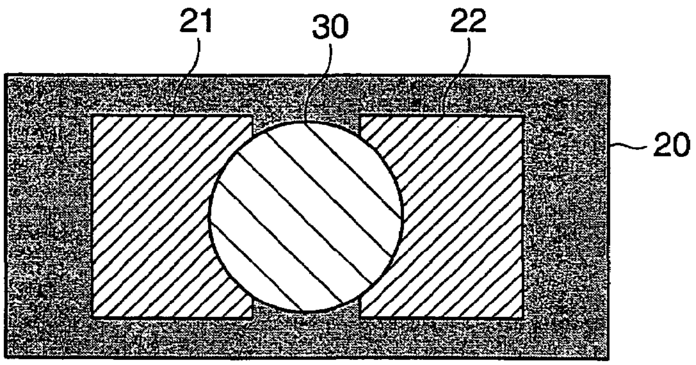
Figure 7C:
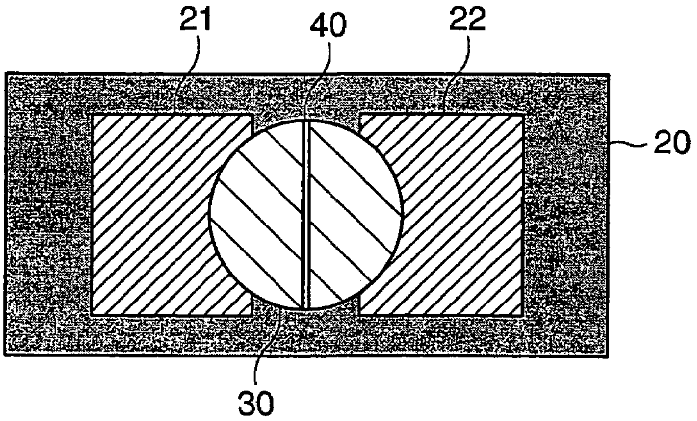

FIG. 6F is an example of a front type projector manufactured according to the manufacturing process of the invention. The projector 480 has an electro-optical device (image display source) 400 and an optical system 481 in a frame 482. Images can be displayed on a screen 483. The invention is, for example, applied to manufacturing a plurality of electron emission elements making up an image display source 400.

Not only limited to the above-referenced examples, the invention is also applicable to manufacturing all sorts of electronic devices. For example, it is also applicable to a fax machine with display function, a digital camera finder, a portable TV, a DSP device, a PDA, an electronic note, an electric bulletin board, an advertising display, an IC card and the like.

It should be noted that the invention is not limited to each embodiment referenced above, but various modifications and changes can be implemented within a scope of a gist of the invention.

The entire disclosure of Japanese Patent Application No. 2005-049287, filed Feb. 24, 2005 is expressly incorporated by reference herein.

What is claimed is:

1. A method of forming an electron emission element, the method comprising:

forming first and second electrodes on a substrate;

forming a step pattern between the first and second electrodes;

depositing a liquid material including a conductive material such that a first portion of the liquid material is formed above the step pattern and a second portion of the liquid material is formed above an area where the step pattern is not formed, and the second portion being thicker than the first portion; and drying the liquid material to form a first and second conductive film separated by a slit formed by the drying of the liquid material, the slit being positioned corresponding to the step pattern, the first conductive film contacting the first electrode, the second conductive film contacting the second electrode, and the first and second conductive films being configured such that an electron is emitted between the first and second conductive films.

2. A method of forming an electron emission element, the method comprising:

forming a step pattern on a substrate;

forming a first film so as to cover at least a part of the step pattern;

depositing a liquid material including a conductive material such that a first portion of the liquid material is formed above the step pattern and a second portion of the liquid material is formed above an area where the step pattern is not formed, and the second portion being thicker than the first portion; and drying the liquid material to form a second film and a first slit in the second film in a position corresponding to the step pattern; and etching the first film to form a second slit in the first film, the first film being divided into a first piece and a second piece by the second slit, the first piece and the second piece being configured such that an electron is emitted between the first piece and the second piece.

3. The method of forming the electron emission element according to claim 1, the slit being formed in a taper shape.

4. A method of forming an electron emission element, the method comprising:

forming a first film that includes a conductive material on a substrate;

forming a step pattern on the first film;

depositing a liquid material such that a first portion of the liquid material is formed above the step pattern and a second portion of the liquid material is formed above the first film on which the step pattern is not formed, and the second portion being thicker than the first portion;

drying the liquid material to form a second film and a first slit above the step pattern, the first slit having a taper shape; and forming a second slit in the step pattern by etching the first film.

5. The method of forming the electron emission element according to claim 4, further comprising:

exposing the step pattern and the first film by removing the second film after the forming of the second slit; and forming a third slit in the first film by etching the first film, the first film forming a first electrode and a second electrode, the third slit being positioned between the first electrode and the second electrode.

6. The method of forming the electron emission element according to claim 4, the forming of the step pattern including forming the step pattern such that an end part of the step pattern is positioned above an area where a third slit is to be formed.

* * * * *